US009755019B1

United States Patent
Fung

(10) Patent No.: US 9,755,019 B1
(45) Date of Patent: Sep. 5, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Ka-Hing Fung, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/060,286

(22) Filed: Mar. 3, 2016

(51) Int. Cl.
H01L 21/336 (2006.01)
H01L 29/08 (2006.01)
(Continued)

(52) U.S. Cl.
CPC .. H01L 29/0847 (2013.01); H01L 21/823814 (2013.01); H01L 21/823821 (2013.01); H01L 21/823864 (2013.01); H01L 21/823878 (2013.01); H01L 27/0924 (2013.01); H01L 29/0653 (2013.01); H01L 29/161 (2013.01); H01L 29/165 (2013.01);
(Continued)

(58) Field of Classification Search
CPC .... H01L 29/0847; H01L 29/66795–29/66818; H01L 29/785; H01L 29/7851; H01L 29/7853–29/7858
See application file for complete search history.

(56) References Cited

U.S. PATENT DOCUMENTS

| 7,667,271 | B2 | 2/2010 | Yu et al. |
| 7,910,453 | B2 | 3/2011 | Xu et al. |

(Continued)

FOREIGN PATENT DOCUMENTS

| CN | 103579295 A | 2/2014 |
| CN | 104347425 A | 2/2015 |

OTHER PUBLICATIONS

S. Natarajan et al., A 14nm Logic Technology Featuring 2nd-Generation FinFET Transistors, Air-Gapped Interconnects, Self-Aligned Double Patterning and a 0.0588um2 SRAM cell size, Logic Technology Development, Quality and Reliability Engineering, ETS, Intel Corporation, 3 pages.
(Continued)

*Primary Examiner* — Daniel Shook
(74) *Attorney, Agent, or Firm* — McDermott Will & Emery LLP

(57) ABSTRACT

A semiconductor device includes an isolation layer, first and second fin structures, a gate structure and a source/drain structure. The isolation layer is disposed over a substrate. The first and second fin structures are disposed over the substrate, and extend in a first direction in plan view. Upper portions of the first and second fin structures are exposed from the isolation layer. The gate structure is disposed over parts of the first and second fin structures, and extends in a second direction crossing the first direction. The source/drain structure is formed on the upper portions of the first and second fin structures, which are not covered by the first gate structure and exposed from the isolation layer, and wraps side surfaces and a top surface of each of the exposed first and second fin structures. A void is formed between the source/drain structure and the isolation layer.

20 Claims, 13 Drawing Sheets

(51) Int. Cl.
*H01L 29/06* (2006.01)
*H01L 29/16* (2006.01)
*H01L 29/161* (2006.01)
*H01L 29/165* (2006.01)
*H01L 29/24* (2006.01)
*H01L 29/267* (2006.01)
*H01L 29/78* (2006.01)
*H01L 29/66* (2006.01)
*H01L 21/8238* (2006.01)
*H01L 27/092* (2006.01)

(52) U.S. Cl.
CPC .......... *H01L 29/1608* (2013.01); *H01L 29/24* (2013.01); *H01L 29/267* (2013.01); *H01L 29/665* (2013.01); *H01L 29/66795* (2013.01); *H01L 29/7848* (2013.01); *H01L 29/7851* (2013.01)

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0191335 A1 | 7/2014 | Yin et al. |
| 2015/0035023 A1 | 2/2015 | Kim et al. |
| 2015/0079751 A1* | 3/2015 | Alptekin ............... H01L 29/785 438/283 |
| 2015/0318399 A1* | 11/2015 | Jeong ................. H01L 29/7853 257/401 |
| 2016/0043170 A1 | 2/2016 | Park et al. |

OTHER PUBLICATIONS

Office Action Taiwanese Patent Application No. 105126054 dated Mar. 28, 2017.

\* cited by examiner

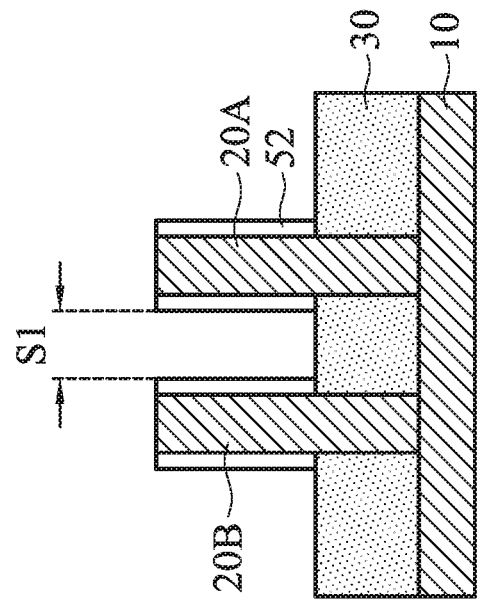
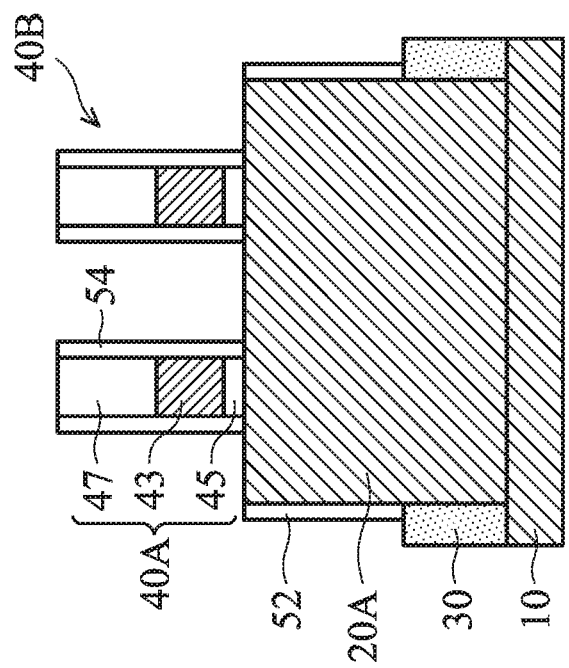
FIG. 3A
FIG. 3B

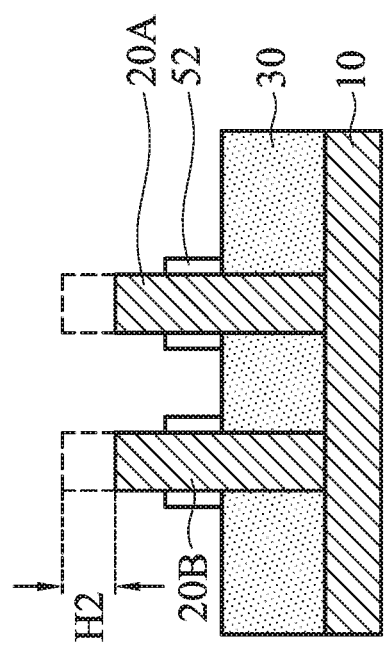
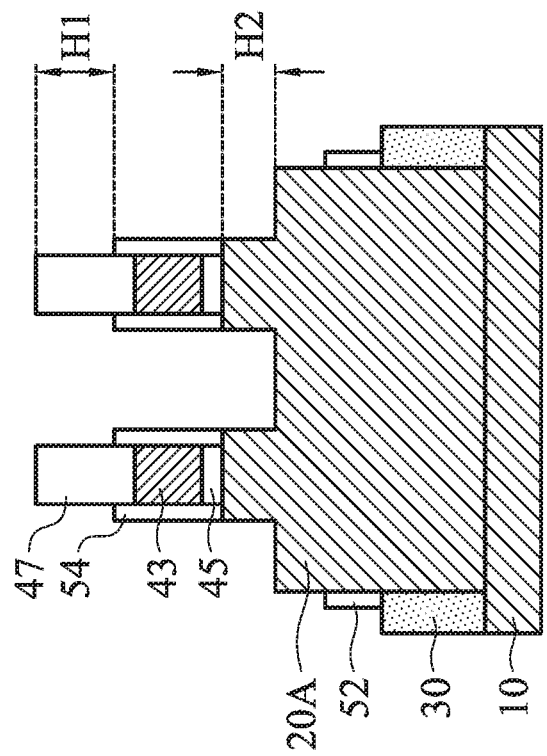
FIG. 4A
FIG. 4B

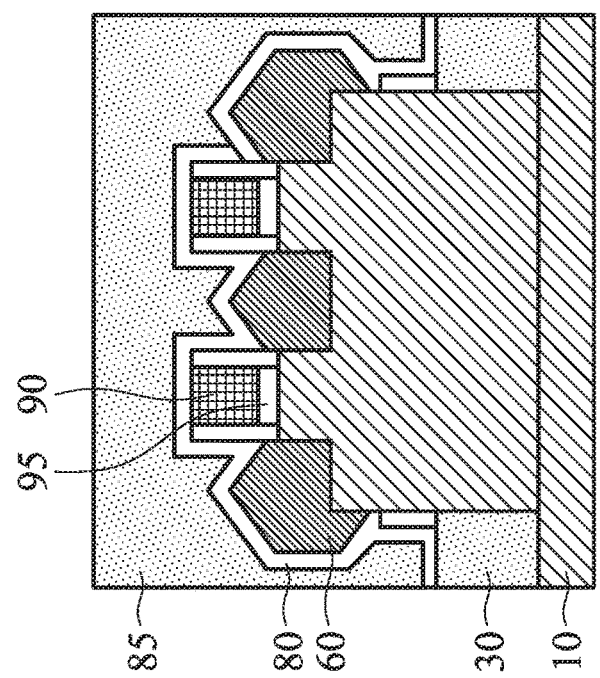
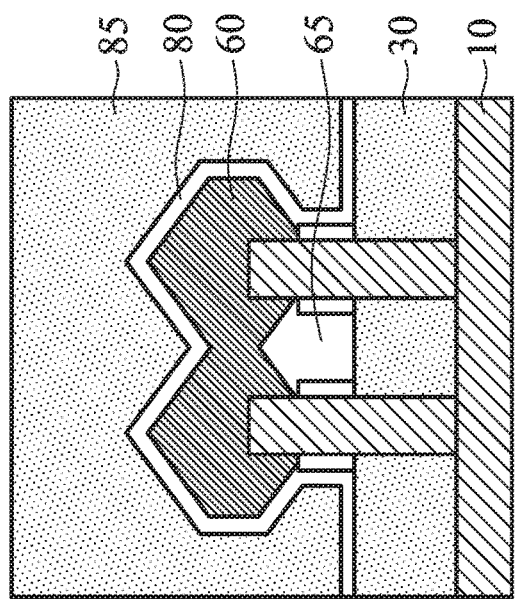
FIG. 9A
FIG. 9B

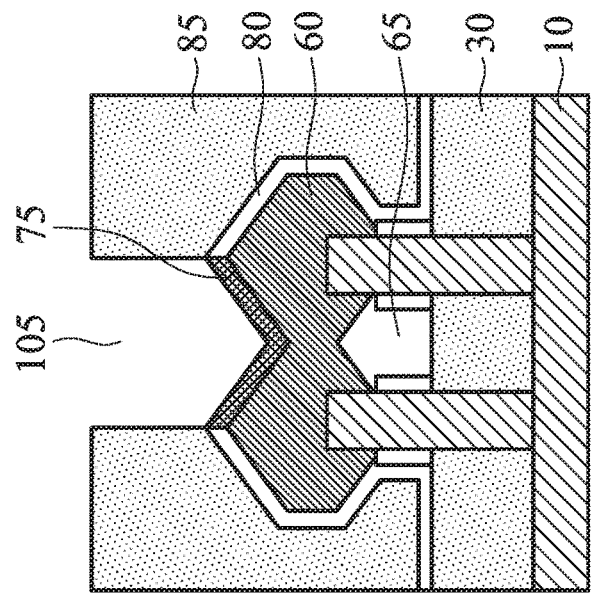
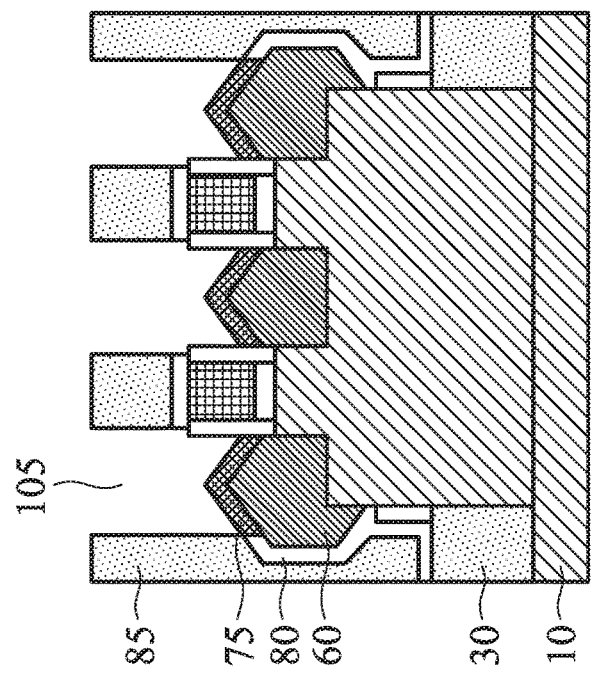
FIG. 10A
FIG. 10B

United States Patent
US 9,755,019 B1

SEMICONDUCTOR DEVICE AND MANUFACTURING METHOD THEREOF

TECHNICAL FIELD

The disclosure relates to a semiconductor integrated circuit, and more particularly to a semiconductor device having an epitaxial source/drain (S/D) structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-7B show exemplary cross sectional views of various stages for manufacturing a Fin FET device according to one embodiment of the present disclosure.

FIGS. 9A-11B show exemplary cross sectional views of various stages for manufacturing a Fin FET device according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, additional operations can be provided before, during, and after the processes, and some of the operations described below can be replaced or eliminated, for additional embodiments of the method. The order of the operations/processes may be interchangeable.

Figure 1:
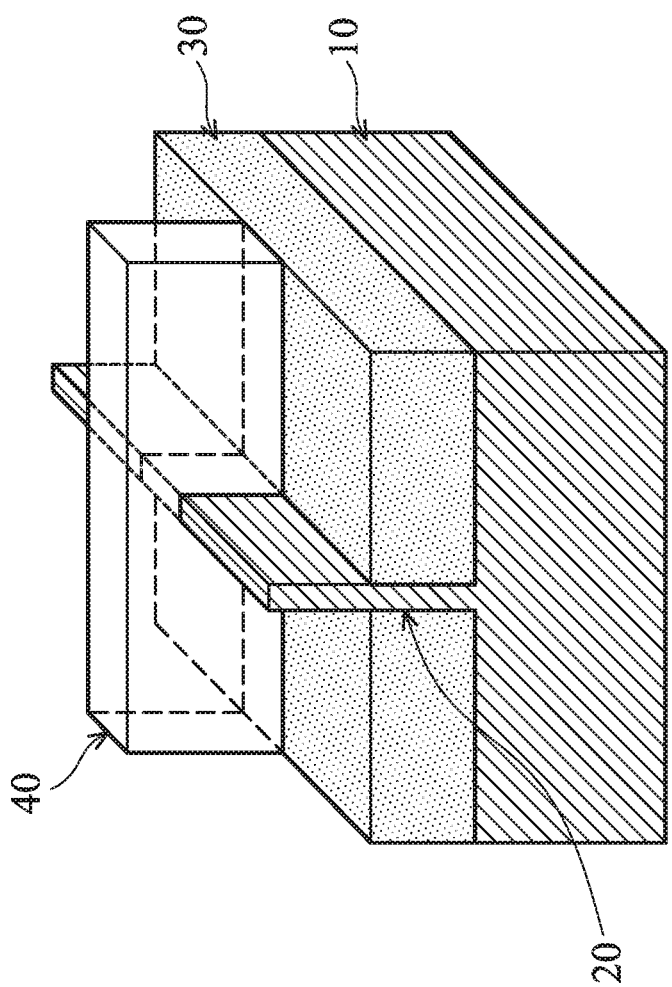
FIG. 1 is an exemplary perspective view of a Fin FET device.

FIG. 1 is an exemplary perspective view of a semiconductor FET device having a fin structure (Fin FET).

The Fin FET devices include, among other features, a substrate 10, a fin structure 20, a isolation insulating layer 30 and a gate structure 40. In this embodiment, the substrate 10 is a silicon substrate. Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

One or more fin structures 20 are disposed over the substrate 10. The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

In FIG. 1, one fin structure 20 is disposed over the substrate 10. However, the number of the fin structures is not limited to one. The numbers may be more than one. In addition, one or more dummy fin structures may be disposed adjacent both sides of the fin structure 20 to improve pattern fidelity in patterning processes. The width of the fin structure 20 is in a range from about 5 nm to about 40 nm in some embodiments, and is in a range from about 7 nm to about 12 nm in other embodiments. The height of the fin structure 20 is in a range from about 100 nm to about 300 nm in some embodiments, and is in a range from about 50 nm to 100 nm in other embodiments.

The lower part of the fin structure 20 under the gate structure 40 may be referred to as a well region, and the upper part of the fin structure 20 may be referred to as a channel region. Under the gate structure 40, the well region is embedded in the isolation insulating layer 30, and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Further, spaces between the fin structures and/or a space between one fin structure and another element formed over the substrate 10 are filled by the isolation insulating layer 30 (or so-called a "shallow-trench-isolation (STI)" layer) including an insulating material. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl ortho-silicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 2:
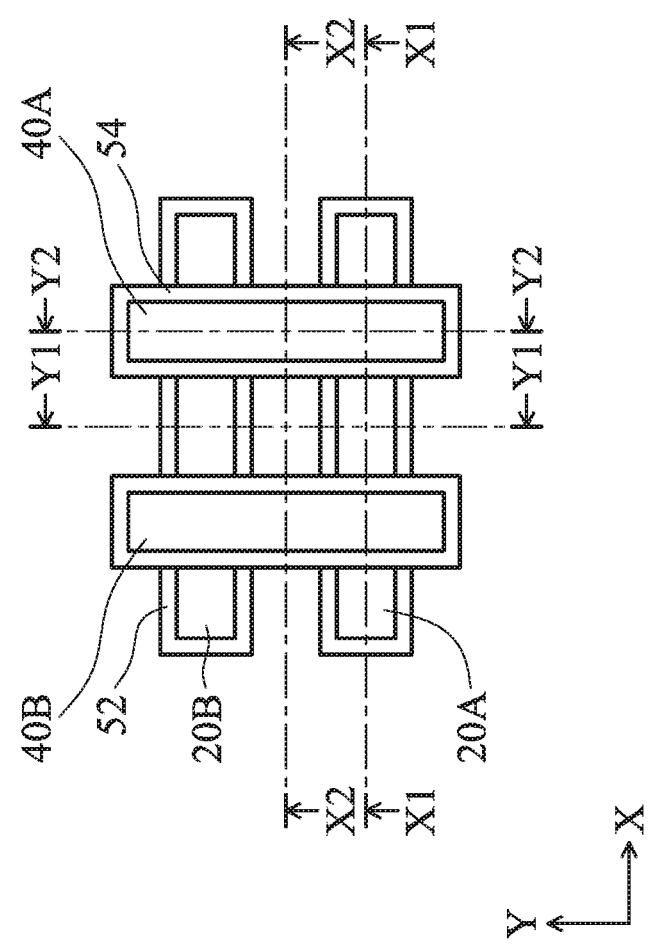
FIG. 2 is an exemplary plan view of a Fin FET device according to one embodiment of the present disclosure.
Figure 3D:
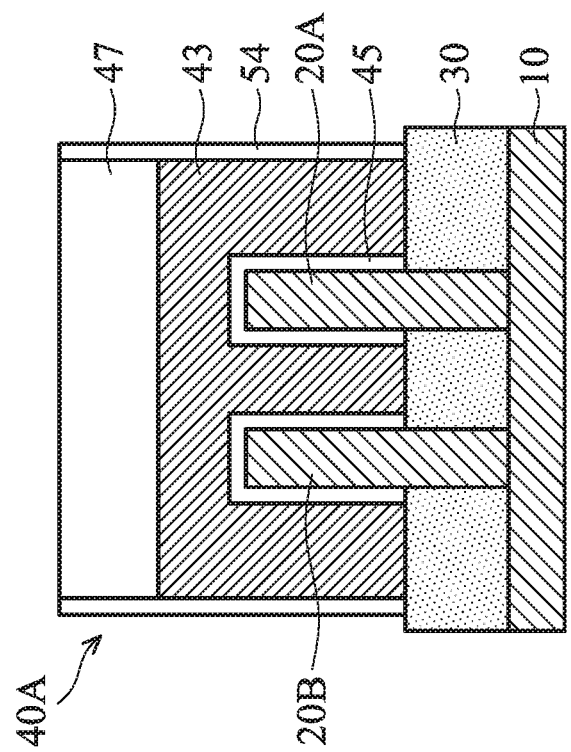
Figure 3C:
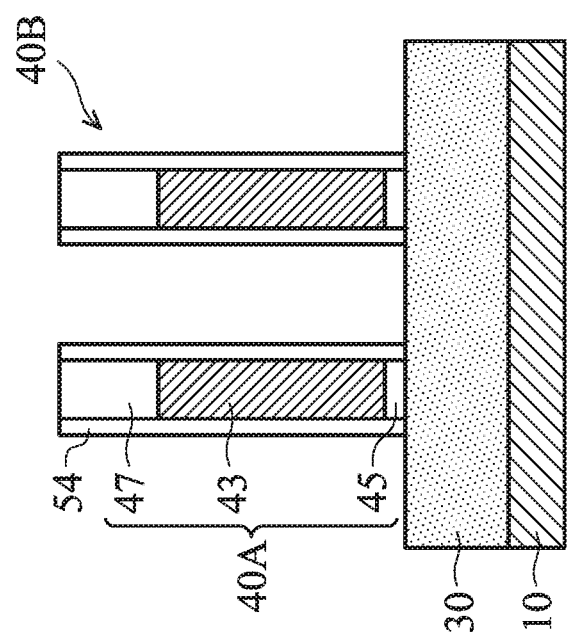

FIG. 2 is an exemplary plan view of a Fin FET device after the gate structures are formed according to one embodiment of the present disclosure. FIGS. 3A-3D show exemplary cross sectional views along line X1-X1 (FIG. 3A), Y1-Y1 (FIG. 3B), X2-X2 (FIG. 3C) and Y2-Y2 (FIG. 3D) of FIG. 2.

As shown in FIGS. 2 and 3A-3D, a first fin structure 20A and a second fin structure 20B are formed over the substrate 10.

To fabricate fin structures according to one embodiment, a mask layer is formed over a substrate. The mask layer is formed by, for example, a thermal oxidation process and/or a chemical vapor deposition (CVD) process. The substrate 10 is, for example, a p-type silicon or germanium substrate with an impurity concentration in a range from about $1 \times 10^{15}$ $cm^{-3}$ to about $1 \times 10^{16}$ $cm^{-3}$. In other embodiments, the substrate is an n-type silicon or germanium substrate with an impurity concentration in a range from about $1 \times 10^{15}$ $cm^{-3}$ to about $1 \times 10^{16}$ $cm^{-3}$. The mask layer includes, for example, a pad oxide (e.g., silicon oxide) layer and a silicon nitride mask layer in some embodiments.

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LP-CVD), a high density plasma CVD (HDPCVD), an atomic layer deposition (ALD), and/or other processes.

The thickness of the pad oxide layer is in a range from about 2 nm to about 15 nm and the thickness of the silicon nitride mask layer is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range from about 5 nm to about 40 nm in some embodiments. In certain embodiments, the width of the hard mask patterns is in a range from about 7 nm to about 12 nm.

By using the hard mask pattern as an etching mask, the substrate 10 is patterned into fin structures by trench etching using a dry etching method and/or a wet etching method. The width of the fin structures is in a range from about 4 nm to about 15 nm in some embodiments and a space between two fin structures is in a range from about 10 nm to about 50 nm in some embodiments.

After the fin structures 20A and 20B are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-K dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl ortho-silicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

The insulating layer 30 is first formed in a thick layer so that the fin structures are embedded in the thick layer, and the thick layer is recessed so as to expose the upper portions of the fin structures 20A and 20B. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

After the insulating layer 30 is formed, a first gate structure 40A and a second gate structure 40B are formed over the fin structures 20A and 20B.

To fabricate the gate structures, a dielectric layer and a poly silicon layer are formed over the isolation insulating layer 30 and the exposed fin structures, and then patterning operations are performed so as to obtain gate structures including a gate pattern 43 made of poly silicon and a dielectric layer 45. In some embodiments, the polysilicon layer is patterned by using a hard mask and the hard mask remains on the gate pattern 43 as a cap insulating layer 47. The hard mask (cap insulating layer 47) includes one or more layers of insulating material. The cap insulating layer 47 includes a silicon nitride layer formed over a silicon oxide layer in some embodiments. In other embodiments, the cap insulating layer 47 includes a silicon oxide layer formed over a silicon nitride layer. The insulating material for the cap insulating layer 47 may be formed by CVD, PVD, ALD, e-beam evaporation, or other suitable process. In some embodiments, the dielectric layer 45 may include one or more layers of silicon oxide, silicon nitride, silicon oxy-nitride, or high-k dielectrics. In some embodiments, a thickness of the dielectric layer 45 is in a range from about 2 nm to about 20 nm, and in a range from about 2 nm to about 10 nm in other embodiments. In some embodiments, a thickness of the gate structures is in a range from about 50 nm to about 400 nm in some embodiments, and is in a range from about 100 nm to 200 nm in other embodiments.

In the present embodiment, a gate replacement technology is employed. Accordingly, the gate pattern 43 and the dielectric layer 45 are a dummy gate electrode and a dummy gate dielectric layer, respectively, which are subsequently removed.

Further, gate sidewall spacers 54 are formed on both sidewalls of the gate structures 40A, 40B, and fin sidewall spacers 52 are also formed on both sidewalls of the fin structures 20A, 20B. The sidewall spacers 54, 52 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 54, 52 are formed by forming a blanket layer of insulating material and performing anisotropic etching. As shown in FIG. 3B, the upper surfaces of the fin structures 20A, 20B are exposed. In one embodiment, the sidewall spacer layers are made of silicon nitride based material, such as SiN, SiON, SiOCN or SiCN. In one embodiment, the space S1 between the fin structures 20A and 20B with the sidewall spaces is in a range from about 5 nm to about 30 nm.

Then, as shown in FIGS. 4A and 4B, the upper portions of the gate sidewall spacers 54 and the fin sidewall spacers 52 are partially removed (recessed). FIG. 4A is an exemplary cross sectional view corresponding to line X1-X1 of FIG. 2, and FIG. 4B is an exemplary cross sectional view corresponding to line Y1-Y1 of FIG. 2.

By using an anisotropic dry etching operation, the upper portions of the gate sidewall spacers 54 and the fin sidewall spacers 52 are partially removed (recessed). The recessed amount H1 is in a range from about 10 nm to about 50 nm.

During this etching, the upper portions of the fin structures 20A, 20B are also slightly etched. Accordingly, the height of the fin structures 20A, 20B are reduced by the amount of H2.

Figure 5B:
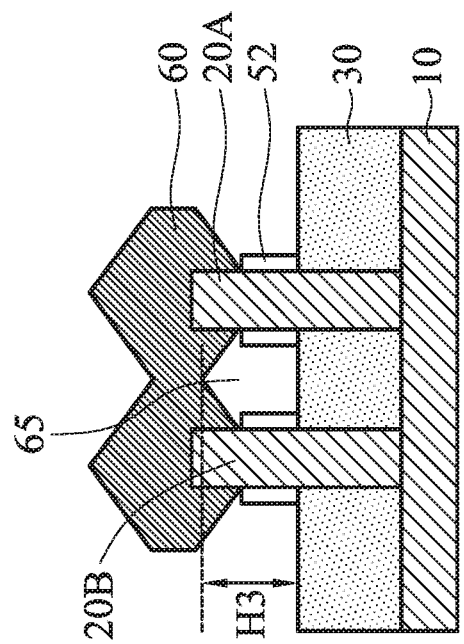
Figure 5A:
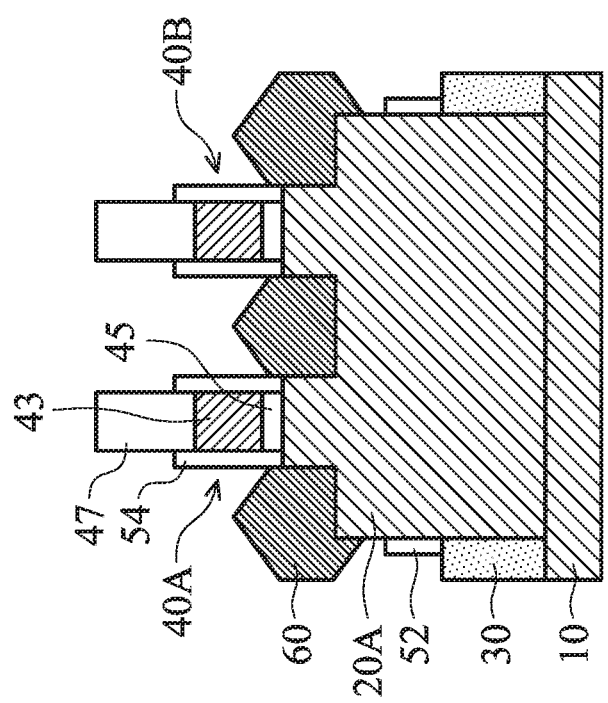
Figure 5C:
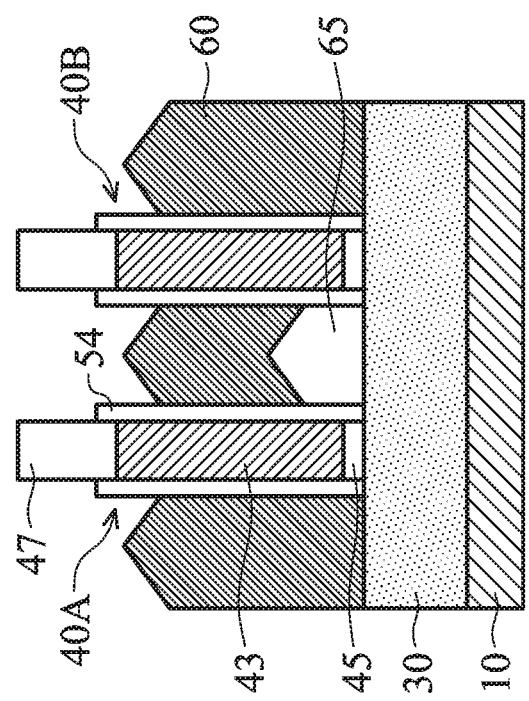

Then, as shown in FIGS. 5A–5C, source/drain structures 60 are formed over the exposed upper portions of the fin structures 20A, 20B. FIG. 5A is an exemplary cross sectional view corresponding to line X1-X1 of FIG. 2, FIG. 5B is an exemplary cross sectional view corresponding to line Y1-Y1 of FIG. 2, and FIG. 5C is an exemplary cross sectional view corresponding to line X2-X2 of FIG. 2.

The source/drain structures 60 are made of one or more layers of semiconductor material having a different lattice constant than the fin structures (channel regions). When the fin structures are made of Si, the source/drain structures 60 include SiP, SiC or SiCP for an n-channel Fin FET and SiGe or Ge for a p-channel Fin FET. The source/drain structures 60 are epitaxially formed over the upper portions of the fin structures 20A, 20B. Due to the crystal orientation of the substrate formed into the fin structures 20A, 20B (e.g., (100) plane), the source/drain structures 60 grow laterally and have a diamond-like shape. In one embodiment, the amount H2 is set smaller than the lateral growth amount of the source/drain structures 60. The lateral growth amount measured from the center of the fin structure is in a range from about S1 to about 1.4×S1 (see, FIG. 3B).

The source/drain epitaxial layer 60 may be grown at a temperature of about 600 to 800° C. under a pressure of about 80 to 150 Torr, by using a Si containing gas such as $SiH_4$, $Si_2H_6$, $SiCl_2H_2$ and a dopant gas, such as $PH_3$. The source/drain structure for an n-channel FET and the source/drain structure for a p-channel FET may be formed by separate epitaxial processes.

As shown in FIG. 5B, since the upper portions of the fin structures 20A, 20B protrude from the isolation insulating layer 30 and the fin sidewall spacers 52, the source/drain structures are formed on side surfaces and a top surface of the upper portions of the first and second fin structures 20A and 20B. As shown in FIG. 5A, the source/drain structures 60 grow above the uppermost portion of the fin structures 20A, 20B.

Further, due to the relatively small space between the fin structures, the source/drain structure formed over the first fin structure 20A and the source/drain structure formed over the second fin structure 20B are merged such that a void or a gap (an air gap) 65 is formed by the merged second source/drain structures 60, the isolation insulating layer 30, one of the gate sidewall spacers 54 of the first gate structure 40A and one of the gate sidewall spacers of the second gate structure 40B.

The height H3 of the void 65 from the surface of the isolation insulating layer 30 is in a range from about 10 nm to about 40 nm in some embodiments.

Figure 6A:
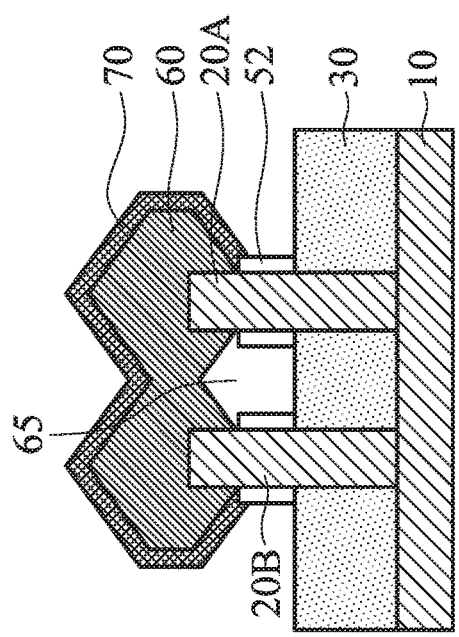
Figure 6B:
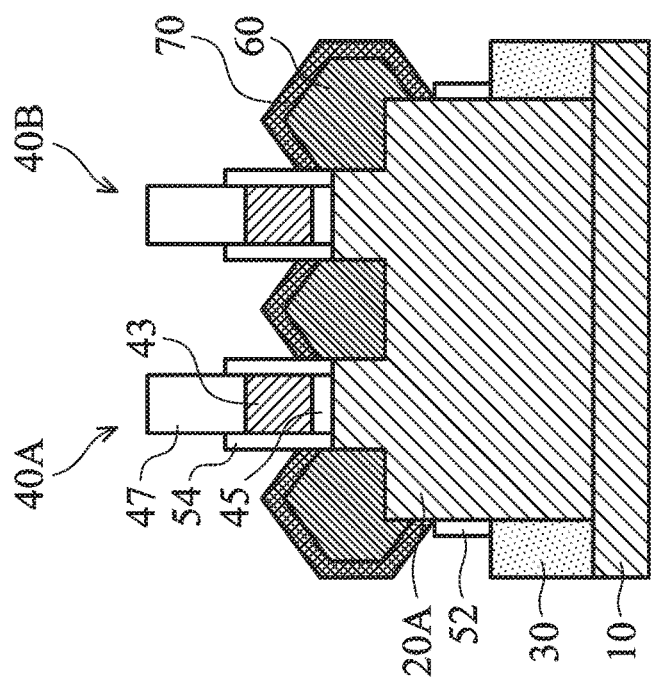

Then, as shown in FIGS. 6A and 6B, a silicide layer 70 is formed over the source/drain structures 60. FIG. 6A is an exemplary cross sectional view corresponding to line X1-X1 of FIG. 2, and FIG. 6B is an exemplary cross sectional view corresponding to line Y1-Y1 of FIG. 2.

After the source/drain structures 60 are formed, a metal material, such as Ni, Ti, Ta and/or W, is formed over the source/drain structures 60, and an annealing operation is performed to form a silicide layer 70. In other embodiments, a silicide material, such as NiSi, TiSi, TaSi and/or WSi, is formed over the source/drain structures 60, and an annealing operation may be performed. The annealing operation is performed at a temperature of about 250° C. to about 850° C. The metal material or the silicide material is formed by CVD or ALD. The thickness of the silicide layer 70 is in a range from about 4 nm to about 10 nm in some embodiments. Before or after the annealing operations, the metal material or the silicide material formed over the isolation insulating layer 30, the cap isolation layer 47 and the sidewall spacers 52, 54 are selectively removed, by using a wet etching process.

Figure 7A:
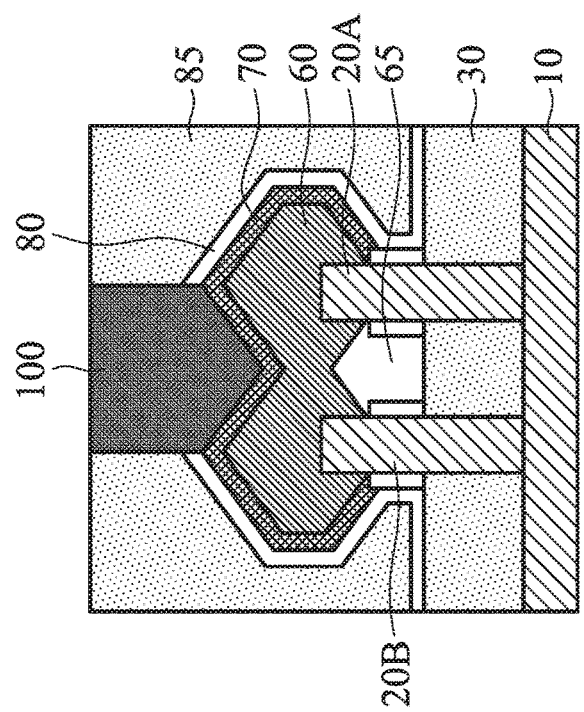
Figure 7B:
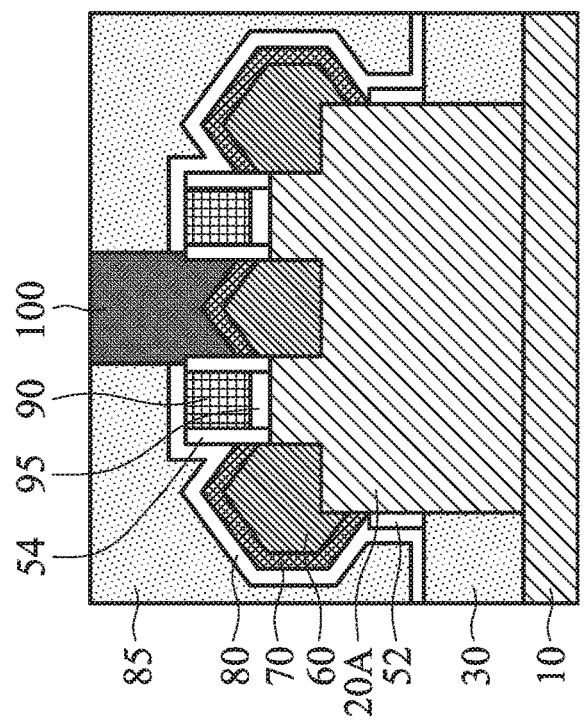

Then, as shown in FIGS. 7A and 7B, a metal gate structure is formed and subsequently, a contact plug is formed. FIG. 7A is an exemplary cross sectional view corresponding to line X1-X1 of FIG. 2, and FIG. 7B is an exemplary cross sectional view corresponding to line Y1-Y1 of FIG. 2.

After forming the silicide layer 70, the dummy gate structures (dummy gate electrode 43 and dummy gate dielectric layer 45) are removed and replaced with a metal gate structures (metal gate electrode 90 and gate dielectric layer 95).

In certain embodiments, a first interlayer dielectric layer is formed over the dummy gate structures and a planarization operation, such as a chemical mechanical polishing (CMP) process or an etch-back process, is performed to expose the upper surface of the dummy gate electrode 43. Then, the dummy gate electrode 43 and the dummy gate dielectric layer 45 are removed, by appropriate etching processes, respectively, to form a gate opening. Metal gate structures including a gate dielectric layer 95 and metal gate electrode 90 are formed in the gate openings.

The gate dielectric layer 95 may be formed over an interface layer (not shown) disposed over the channel layer of the fin structures 20A, 20B. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer 95 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode 90 is formed over the gate dielectric layer 95. The metal gate electrode 90 includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) may be interposed between the gate dielectric layer 95 and the metal gate electrode 90. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations such as a CMP are performed.

Then, a second interlayer dielectric layer 85 is formed over the formed metal gate structure. In some embodiments, an insulating layer 80, functioning as a contact etching stop layer, is formed over the formed metal gate structure and then the second interlayer dielectric layer 85 is formed.

The insulating layer 80 is one or more layers of insulating material. In one embodiment, the insulating layer 80 is made of silicon nitride formed by CVD.

By using a patterning operation including lithography, contact holes are formed in the second interlayer dielectric layer 85 and the insulating layer 80, so as to expose source and drain structures 60 with the silicide layer 70. Then, the contact hole is filled with a conductive material, thereby forming a contact plug 100. The contact plug 100 may include a single layer or multiple layers of any suitable metal such as Co, W, Ti, Ta, Cu, Al and/or Ni and/or nitride thereof.

After forming the contact plug, further CMOS processes are performed to form various features such as additional interlayer dielectric layer, contacts/vias, interconnect metal layers, and passivation layers, etc.

Figure 8:
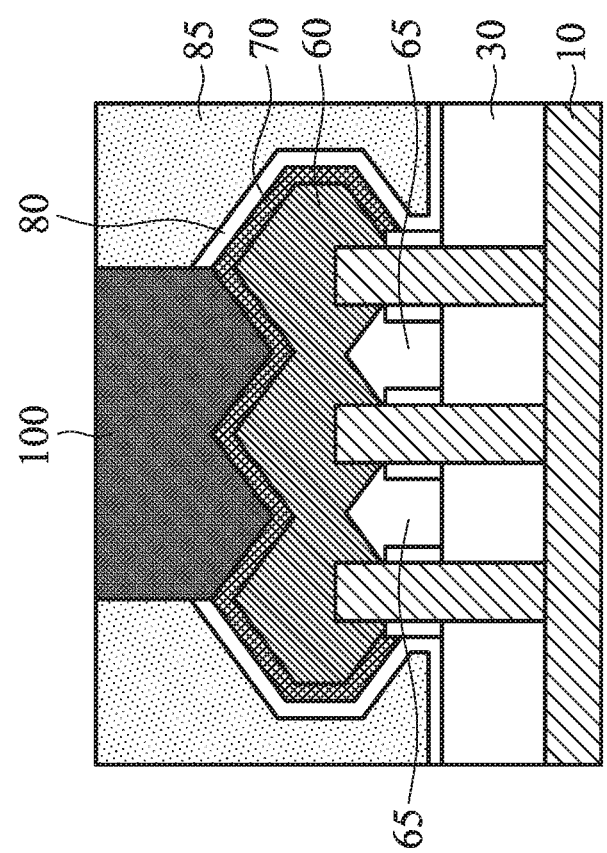
FIG. 8 is an exemplary cross sectional view of a Fin FET device according to another embodiment of the present disclosure.

FIG. 8 is an exemplary cross sectional view of a Fin FET device according to another embodiment of the present disclosure. In the embodiment of FIG. 8, three fin structures are disposed over the substrate and two voids 65 are formed in the spaces between adjacent two fin structures.

FIGS. 9A-11B show exemplary cross sectional views of various stages for manufacturing a Fin FET device according to another embodiment of the present disclosure. In this embodiment, the timing of forming the silicide layer is different from the above embodiment. The configuration, materials or operations the same as or similar to those in the above embodiment may be employed in this embodiment, and the detailed explanation thereof may be omitted.

After forming the source/drain structures 60 as shown in FIGS. 5A-5C, the metal gate structures 90, 95, the insulating layer 80 (contact etching stop layer) and the interlayer dielectric layer 85 are formed, without forming a silicide layer, as shown in FIGS. 9A and 9B. FIG. 9A is an exemplary cross sectional view corresponding to line X1-X1 of FIG. 2, and FIG. 9B is an exemplary cross sectional view corresponding to line Y1-Y1 of FIG. 2.

Then, as shown in FIGS. 10A and 10B, contact holes 105 are formed in the insulating layer 80 and the interlayer dielectric layer 85 to expose the upper surface of the source/drain structures 60, and then a silicide layer 75 is formed on the upper surface of the source/drain structures 60. FIG. 10A is an exemplary cross sectional view corresponding to line X1-X1 of FIG. 2, and FIG. 10B is an exemplary cross sectional view corresponding to line Y1-Y1 of FIG. 2.

Figure 11B:
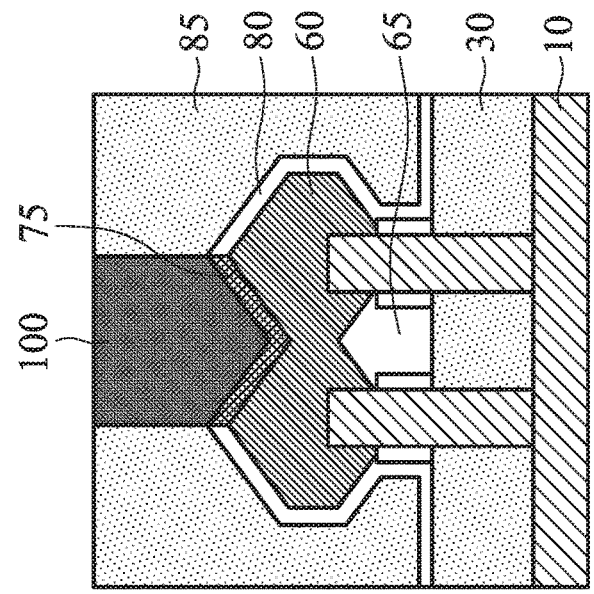
Figure 11A:
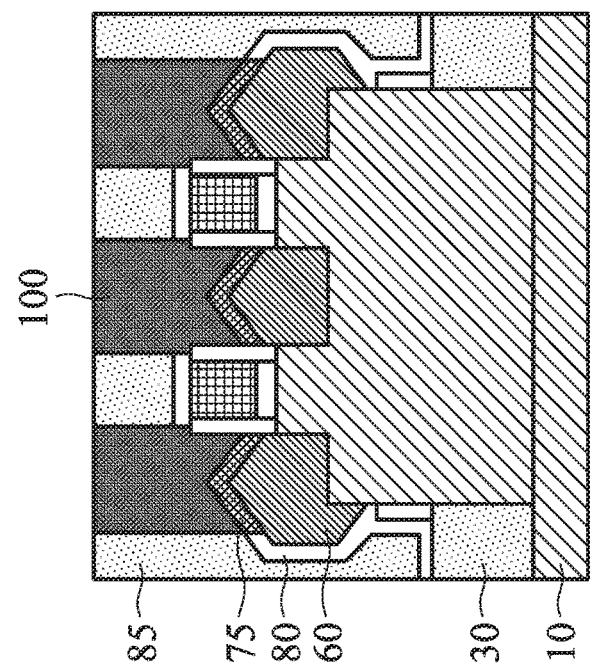

After forming the silicide layer 75, the conductive material is formed in the contact holes 105, thereby forming contact plugs 100, as shown in FIGS. 11A and 11B. FIG. 11A is an exemplary cross sectional view corresponding to line X1-X1 of FIG. 2, and FIG. 11B is an exemplary cross sectional view corresponding to line Y1-Y1 of FIG. 2.

After forming the contact plugs, further CMOS processes are performed to form various features such as additional interlayer dielectric layer, contacts/vias, interconnect metal layers, and passivation layers, etc.

In the present disclosure, since a void is formed between the source/drain epitaxial layer and the isolation insulting layer (STI), a parasitic capacitance at the source/drain structure can be reduced.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a first fin structure and a second fin structure are formed over a substrate. The first and second fin structures extend in a first direction in plan view. An isolation insulating layer is formed over the substrate so that lower portions of the first and second fin structures are embedded in the isolation insulating layer and upper portions of the first and second fin structures are exposed from the isolation insulating layer. A gate structure is formed over parts of the first and second fin structure. The gate structure includes a gate pattern, a dielectric layer disposed between the gate pattern and the first and second fin structures, a cap insulating layer disposed over the gate pattern. The gate structure extends in a second direction crossing the first direction in plan view. Gate sidewall spacers are formed on sidewalls of the gate structure. Upper portions of the gate sidewall spacers are recessed. A first source/drain structure is formed over the first fin structure not covered by the gate structure and the gate sidewall spacers, and a second source/drain structure is formed over the second fin structure not covered by the gate structure and the gate sidewall spacers. In the recessing the upper portions of the gate sidewall spacers, upper portions of the first and second fin structures not covered by the gate structure are also recessed. In the forming the first source/drain structure, the first source/drain structure is formed on side surfaces and a top surface of the recessed first and second fin structures. The first and second source/drain structures are merged such that a void is formed between the merged first and second source/drain structures and the isolation insulating layer.

In accordance with another aspect of the present disclosure, in a method of manufacturing a semiconductor device including a Fin FET, a first fin structure and a second fin structure are formed over a substrate. The first and second fin structures extend in a first direction in plan view. An isolation insulating layer is formed over the substrate so that lower portions of the first and second fin structures are embedded in the isolation insulating layer and upper portions of the first and second fin structures are exposed from the isolation insulating layer. A first gate structure and a second gate structure are formed over parts of the first and second fin structure. Each of the first and second gate structures includes a gate pattern, a dielectric layer disposed between the gate pattern and the first and second fin structures, a cap insulating layer disposed over the gate pattern. The first and second gate structures extend in a second direction crossing the first direction in plan view. First gate sidewall spacers are formed on sidewalls of the first gate structure, and second gate sidewall spacers are formed on sidewalls of the second gate structure. Upper portions of the first and second gate sidewall spacers are recessed. A first source/drain structure is formed over the first fin structure not covered by the first and second gate structures and the first and second gate sidewall spacers, and a second source/drain structure is formed over the second fin structure not covered by the first and second gate structures and the first and second gate sidewall spacers. In the recessing the upper portions of the first and second gate sidewall spacers, upper portions of the first and second fin structures not covered by the first and second gate structures are also recessed. In the forming the first source/drain structure, the first source/drain structure is formed on side surfaces and a top surface of the recessed first and second fin structures. The first and second source/drain structures are merged such that a void formed by the merged first and second source/drain structures, the isolation insulating layer, one of the first gate sidewall spacers and one of the second gate sidewall spacers, the one of the first gate sidewall spacers facing the one of the second gate sidewall spacers.

In accordance with another aspect of the present disclosure, a semiconductor device includes an isolation insulating layer, a first fin structure and a second fin structure, a first gate structure, and a source/drain structure. The isolation insulating layer is disposed over a substrate. Both the first fin structure and the second fin structure are disposed over the substrate. The first and second fin structures extend in a first direction in plan view. Upper portions of the first and second fin structures are exposed from the isolation insulating layer. The first gate structure is disposed over parts of the first and second fin structures, and extends in a second direction crossing the first direction. The source/drain structure is formed on the upper portions of the first and second fin structures, which are not covered by the first gate structure and exposed from the isolation insulating layer, and wrapping side surfaces and a top surface of each of the exposed first and second fin structures. A void is formed between the source/drain structure and the isolation insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a Fin FET, the method comprising:
    forming a first fin structure and a second fin structure over a substrate, the first and second fin structures extending in a first direction in plan view;
    forming an isolation insulating layer over the substrate so that lower portions of the first and second fin structures are embedded in the isolation insulating layer and upper portions of the first and second fin structures are exposed from the isolation insulating layer;
    forming a gate structure over parts of the first and second fin structures, the gate structure including a gate pattern, a dielectric layer disposed between the gate pattern and the first and second fin structures, and a cap insulating layer disposed over the gate pattern, the gate structure extending in a second direction crossing the first direction in plan view;
    forming gate sidewall spacers on sidewalls of the gate structure;
    recessing upper portions of the gate sidewall spacers; and
    forming a first source/drain structure over the first fin structure not covered by the gate structure and the gate sidewall spacers and a second source/drain structure over the second fin structure not covered by the gate structure and the gate sidewall spacers, wherein:
    in the recessing the upper portions of the gate sidewall spacers, upper portions of the first and second fin structures not covered by the gate structure are also recessed,
    in the forming the first source/drain structure, the first source/drain structure is formed on side surfaces and a top surface of the recessed first and second fin structures, and the first and second source/drain structures are merged such that a void is formed between the merged first and second source/drain structures and the isolation insulating layer.

2. The method of claim 1, wherein in the forming the gate sidewall spacers, fin sidewall spacers are formed on sidewalls of the first and second fin structures.

3. The method of claim 2, wherein in the recessing the upper portions of the gate sidewall spacers, upper portions of the fin sidewall spacers are also recessed.

4. The method of claim 1, further comprising, after the first and second source/drain structures are formed:
   forming a silicide layer on the merged first and second source/drain structures;
   forming an interlayer insulating layer;
   forming an opening in the interlayer insulating layer; and
   forming a conductive material over the silicide layer in the opening.

5. The method of claim 4, wherein the silicide layer is formed before forming the interlayer insulating layer.

6. The method of claim 4, wherein the silicide layer is formed after the opening is formed.

7. The method of claim 4, further comprising forming an insulating layer before forming the interlayer insulating layer.

8. The method of claim 1, further comprising, after the first and second source/drain structures are formed:
   removing the cap insulating layer, the gate pattern and the dielectric layer so as to make a gate space;
   forming a gate dielectric layer in the gate space; and
   forming a gate electrode on the gate dielectric layer in the gate space.

9. A method of manufacturing a semiconductor device including a Fin FET, the method comprising:
   forming a first fin structure and a second fin structure over a substrate, the first and second fin structures extending in a first direction in plan view;
   forming an isolation insulating layer over the substrate so that lower portions of the first and second fin structures are embedded in the isolation insulating layer and upper portions of the first and second fin structures are exposed from the isolation insulating layer;
   forming a first gate structure and a second gate structure over parts of the first and second fin structures, each of the first and second gate structures including a gate pattern, a dielectric layer disposed between the gate pattern and the first and second fin structures, and a cap insulating layer disposed over the gate pattern, the first and second gate structures extending in a second direction crossing the first direction in plan view;
   forming first gate sidewall spacers on sidewalls of the first gate structure and second gate sidewall spacers on sidewalls of the second gate structure;
   recessing upper portions of the first and second gate sidewall spacers; and
   forming a first source/drain structure over the first fin structure not covered by the first and second gate structures and the first and second gate sidewall spacers, and a second source/drain structure over the second fin structure not covered by the first and second gate structures and the first and second gate sidewall spacers, wherein:
   in the recessing the upper portions of the first and second gate sidewall spacers, upper portions of the first and second fin structures not covered by the first and second gate structures are also recessed,
   in the forming the first source/drain structure, the first source/drain structure is formed on side surfaces and a top surface of the recessed first and second fin structures, and
   the first and second source/drain structures are merged such that a void is formed by the merged first and second source/drain structures, the isolation insulating layer, one of the first gate sidewall spacers and one of the second gate sidewall spacers, the one of the first gate sidewall spacers facing the one of the second gate sidewall spacers.

10. The method of claim 9, wherein in the forming the first and second gate sidewall spacers, fin sidewall spacers are formed on sidewalls of the first and second fin structures.

11. The method of claim 10, wherein in the recessing the upper portions of the first and second gate sidewall spacers, upper portions of the fin sidewall spacers are also recessed.

12. The method of claim 9, further comprising, after the first and second source/drain structures are formed:
   forming a silicide layer on the merged first and second source/drain structures;
   after forming the silicide layer, forming an interlayer insulating layer;
   forming an opening in the interlayer insulating layer; and
   forming a conductive material over the silicide layer in the opening.

13. The method of claim 9, further comprising, after the first and second source/drain structures are formed:
   forming an interlayer insulating layer;
   forming an opening in the interlayer insulating layer;
   forming a silicide layer on the merged first and second source/drain structures exposed in the opening; and
   forming a conductive material over the silicide layer in the opening.

14. The method of claim 9, further comprising, after the first and second source/drain structures are formed:
   removing the cap insulating layer, the gate pattern and the dielectric layer from each of the first and second gate structures so as to make a first gate space and a second gate space;
   forming a gate dielectric layer in each of the first and second gate spaces; and
   forming a gate electrode on the gate dielectric layer in each of the first and second gate spaces.

15. A method of manufacturing a semiconductor device including a Fin FET, the method comprising:
   forming a first fin structure and a second fin structure over a substrate, the first and second fin structures extending in a first direction in plan view;
   forming an isolation insulating layer over the substrate so that lower portions of the first and second fin structures are embedded in the isolation insulating layer and upper portions of the first and second fin structures are exposed from the isolation insulating layer;
   forming a gate structure over parts of the first and second fin structures, the gate structure including a gate pattern, a dielectric layer disposed between the gate pattern and the first and second fin structures, a cap insulating layer disposed over the gate pattern, and gate sidewall spacers disposed on sidewalls of the gate pattern and the cap insulating layer, the gate structure extending in a second direction crossing the first direction in plan view;
   forming fin sidewall spacers on sidewalls of the first and second fin structures;

recessing upper portions of the fin sidewall spacers so that top portions of the first and second fin structures are exposed; and forming a source/drain structure over the exposed top portions of the first and second fin structures, wherein:

in the recessing upper portions of the fin sidewall spacers, upper portions of the gate sidewall spacers are also recessed so that the gate cap insulating layer partially protrudes from tops of the gate sidewall spacers, the source/drain structure is a merged source/drain structure in which a void is formed between the merged source/drain structure and the isolation insulating layer, and parts of the fin sidewall spacers are located inside the void.

16. The method of claim 15, wherein in the recessing the upper portions of the fin sidewall spacers, upper portions of the first and second fin structures not covered by the gate structure are also recessed.

17. The method of claim 16, wherein in the forming the source/drain structure, the source/drain structure is formed on side surfaces and a top surface of the recessed first and second fin structures.

18. The method of claim 15, further comprising, after the merged source/drain structure is formed:

forming a silicide layer on the merged source/drain structures;

forming an interlayer insulating layer;

forming an opening in the interlayer insulating layer; and forming a conductive material over the silicide layer in the opening.

19. The method of claim 18, wherein the silicide layer is formed before forming the interlayer insulating layer.

20. The method of claim 15, wherein the fin sidewall spacers are made of a different insulating material than the cap insulating layer.

* * * * *